United States Patent
Chen et al.

(10) Patent No.: US 12,308,801 B2
(45) Date of Patent: May 20, 2025

(54) BACK-GATE CONTROLLED POWER AMPLIFIER

(71) Applicant: GLOBALFOUNDRIES U.S. Inc., Malta, NY (US)

(72) Inventors: Yiching Chen, San Jose, CA (US); Zhixing Zhao, Dresden (DE)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 652 days.

(21) Appl. No.: 17/556,528

(22) Filed: Dec. 20, 2021

(65) Prior Publication Data

US 2023/0198474 A1 Jun. 22, 2023

(51) Int. Cl.
*H03F 1/32* (2006.01)
*H03F 3/213* (2006.01)

(52) U.S. Cl.
CPC ........... *H03F 1/3205* (2013.01); *H03F 3/213* (2013.01)

(58) Field of Classification Search
CPC .......... H03F 1/3205; H03F 3/213; H03F 2203/45318; H03F 2203/45342; H03F 1/3211; H03F 3/195; H03F 3/45183; H03F 1/00; H03F 3/21; H01L 27/088; H03G 3/30
USPC .......................................... 330/277
See application file for complete search history.

(56) References Cited

U.S. PATENT DOCUMENTS

| | | | |
|---|---|---|---|
| 7,177,190 B2 | 2/2007 | Lee | |
| 7,256,646 B2 | 8/2007 | Eid et al. | |
| 10,469,039 B2* | 11/2019 | Lee | H03F 3/245 |
| 10,790,785 B2 | 9/2020 | Chen et al. | |
| 10,896,919 B2 | 1/2021 | Kanno et al. | |
| 2006/0044066 A1 | 3/2006 | Forbes et al. | |
| 2009/0015329 A1* | 1/2009 | Chatterjee | H03F 3/45071 330/253 |
| 2014/0375391 A1* | 12/2014 | Park | H03B 5/1212 331/109 |
| 2015/0349721 A1* | 12/2015 | Samavedam | H03F 3/245 330/253 |

OTHER PUBLICATIONS

Byungho Yook et al., "A CMOS W-Band Amplifier with Tunable Neutralization Using a Cross-Coupled MOS-varactor Pair", Electronics 2019, vol. 8, 537; doi: 10.3390/electronics8050537, www.mdpi.com/journal/electronics, May 13, 2019, 10 pages.

\* cited by examiner

*Primary Examiner* — Andrea Lindgren Baltzell
*Assistant Examiner* — Jose E Pinero
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a differential circuit with automatic parasitic neutralization and gain boost and methods of manufacture. The structure includes a plurality of auxiliary circuit devices with back-gate controls to perform a boost gain, and a differential pair of circuit devices which are connected to the auxiliary circuit devices.

20 Claims, 7 Drawing Sheets

BACK-GATE CONTROLLED POWER AMPLIFIER

BACKGROUND

The present disclosure relates to semiconductor structures and, more particularly, to a differential circuit with automatic parasitic neutralization and gain boost, and methods of manufacture and use.

In known circuits, low gain and bad linearity of a radio frequency (RF)/millimeter wave (mmWave) differential power amplifier design and a gain control circuit may degrade the power amplifier performance. Further, the circuit layout of the RF/mmWave differential power amplifier is complex and area inefficient.

In known circuits, a designer may include two-cross capacitors to cancel out a phase delay between input and output. In one example, a floating source circuit can be used with two-cross capacitors. Although a gain may be high in the floating source circuit, a capacitance varies according to a signal swing level which may compromise the linearity of the floating source circuit. Further, when there is a high swing level at a node, the circuit may have increased oscillations.

In another example, a reference source can be used with the two-cross capacitors. However, in the reference source circuit, it is difficult to layout the reference source and the two-cross capacitors without having a high gain degradation in a RF/mmWave region. Further, when using the reference source and two-cross capacitors, cross-over routings may increase the parasitic charges of the circuit and cause increased circuit complexity.

SUMMARY

In an aspect of the disclosure, a structure includes a plurality of auxiliary circuit devices including back-gate controls to perform a boost gain, and a differential pair of circuit devices connected to the auxiliary circuit devices.

In an aspect of the disclosure, a structure includes a first transistor including a back-gate connected to a divided current control and a source connected to a current source, and a second transistor including a back-gate connected to the divided current control and a source connected to the current source. The divided current control controls a gain using the first back-gate of the first transistor and the second back-gate of the second transistor.

In an aspect of the disclosure, a structure includes a substrate including a plurality of p-wells in a back-gate region on a fully depleted semiconductor on insulator (FD-SOI) substrate, a differential pair of main transistors over a plurality of n-wells, and a plurality of auxiliary devices over the plurality of p-wells. A continuous active region is shared by the differential pair of transistors and the plurality of auxiliary devices.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a differential circuit with automatic parasitic neutralization and gain boost, and methods of manufacture and use. In particular, the present disclosure is directed to a back-gate controlled differential RF/mmWave power amplifier with automatic parasitic neutralization and gain boost. In embodiments, the gain control via the back gates does not affect the front gate operation. Advantageously, the differential circuit with automatic parasitic neutralization and gain boost also provides a high power gain for communication systems in mmWave/RF amplifier design. Further, the present disclosure provides an effective layout by having a compact layout and routing optimization.

The present disclosure includes a current division (i.e., auxiliary transistor path) with back-gate control to boost a maximum available gain/maximum stable gain (MAG/MSG). The circuits described herein include a back-gate control on a fully depleted semiconductor-on-insulator (FD-SOI) substrate, which offers a gain control without affecting a front gate operation. In other words, gain control of the back gate is independent of the operation of the front gate. The differential circuit with automatic parasitic neutralization and gain boost also has a compact layout which includes a triple-well neighboring n-well layout in the back-gate region on the FDSOI that enables different threshold voltage devices laid out on one continuous active region (i.e., Rx) or at a short proximity to the Rx region.

The back-gate controlled power amplifier of the present disclosure may be manufactured in a number of ways using a number of different tools. In general, though, the methodologies and tools are used to form structures with dimensions in the micrometer and nanometer scale. The methodologies, i.e., technologies, employed to manufacture the back-gate controlled power amplifier of the present disclosure have been adopted from integrated circuit (IC) technology. For example, the structures are built on wafers and are realized in films of material patterned by photolithographic processes on the top of a wafer. In particular, the fabrication of the back-gate controlled power amplifier uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any containment, as is known in the art. Moreover, when necessary, rapid thermal anneal processes may be used to drive-in dopants or material layers as is known in the art.

Figure 1:
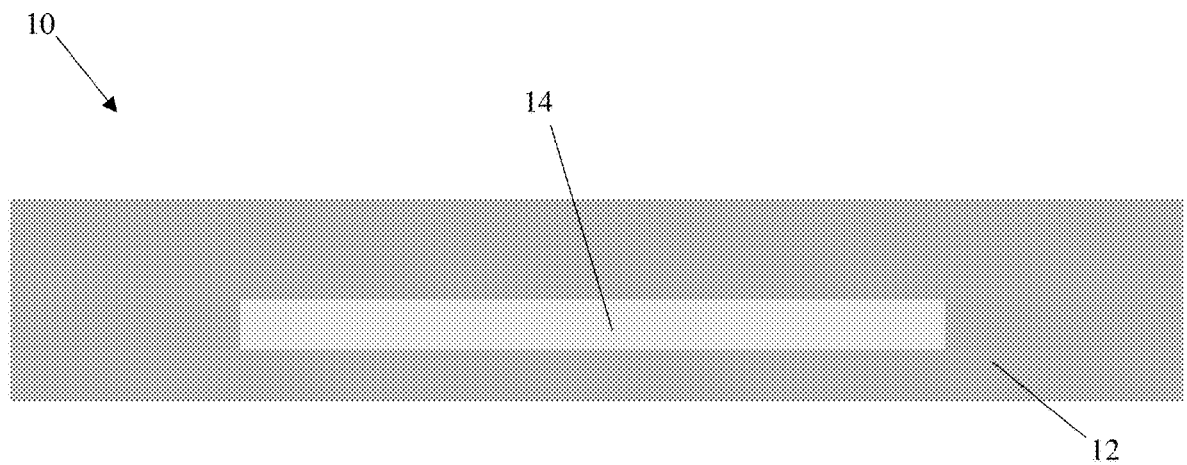
FIGS. 1-3 show structures of the back-gate controlled power amplifier, amongst other features, and respective fabrication processes in accordance with aspects of the present disclosure.
Figure 2:
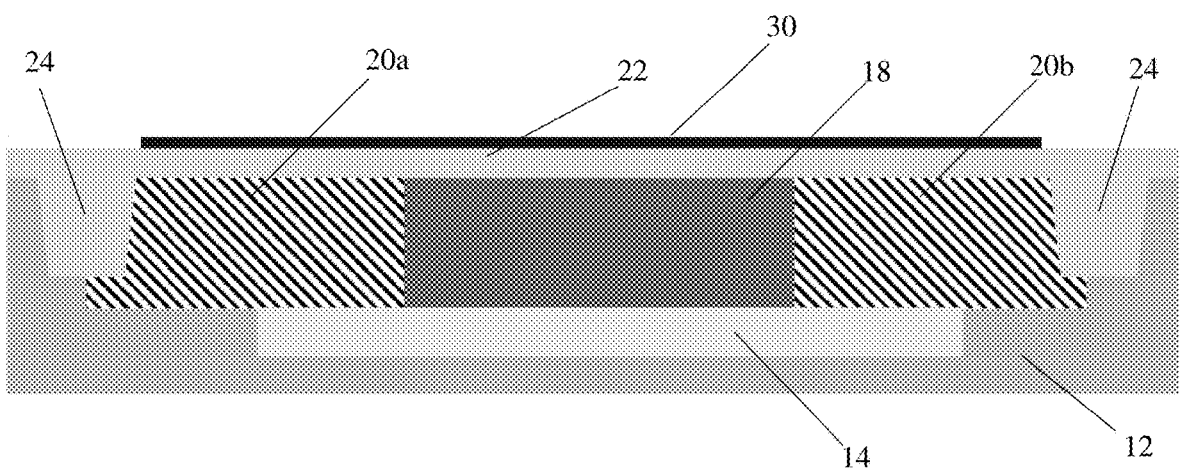
Figure 3:
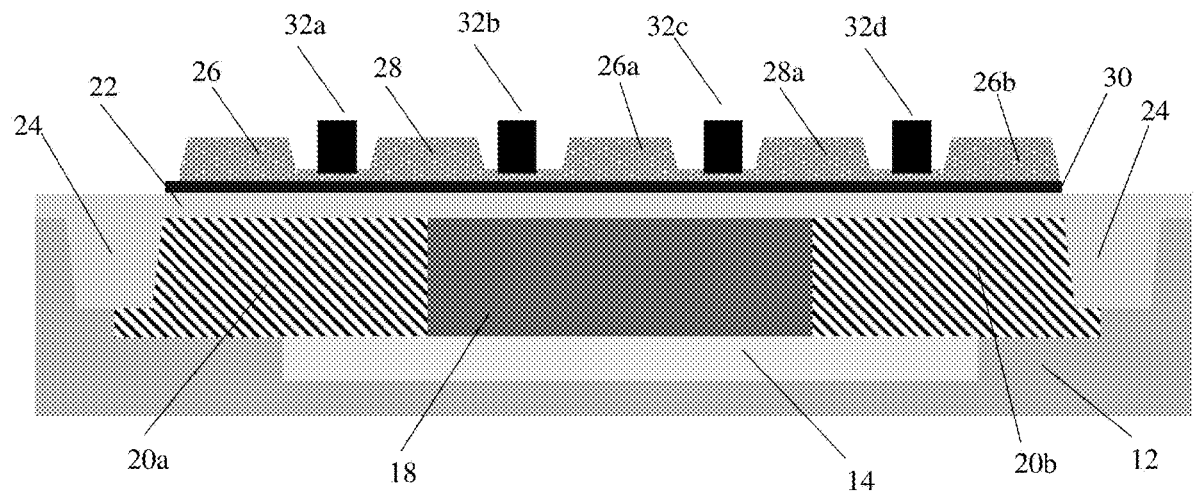

FIGS. 1-3 show structures of the back-gate controlled power amplifier, amongst other features, and respective fabrication processes in accordance with aspects of the present disclosure. More specifically, in FIG. 1, the structure 10 includes a substrate 12. In embodiments, the substrate 12 may be composed of any suitable semiconductor material including, but not limited to, Si, SiGe, SiGeC, SiC, GaAs, InAs, InP, and other III/V or II/VI compound semiconductors. Further, the substrate 12 may be a p-type semiconductor material.

Still referring to FIG. 1, a deep n-well 14 may be formed in the substrate 12. The deep n-well 14 may be formed by conventional ion implant processes using an n-type dopant. As with any wells described herein, the deep n-well 14 may be formed by introducing a dopant by, for example, ion implantation that introduces a concentration of a dopant in the substrate and fin structure. In embodiments, patterned implantation masks may be used to define selected areas exposed for the implantations. The implantation mask used to select the exposed area for forming the deep n-well 14 is stripped after implantation. The implantation mask may include a layer of a light-sensitive material, such as an organic photoresist, applied by a spin coating process, pre-baked, exposed to light projected through a photomask, baked after exposure, and developed with a chemical developer. The implantation masks have a thickness and stopping power sufficient to block masked areas against receiving a dose of the implanted ions. The deep n-well 14 is doped with n-type dopants, e.g., Arsenic (As), Phosphorus (P) and Sb, among other suitable examples.

As shown in FIG. 2, a p-well 18 and n-wells 20a, 20b may be formed over the deep n-well 14 within the substrate 12. Further, an insulator layer 22 may be formed on the substrate 12, over the p-well 18 and the n-wells 20a, 20b. The insulator layer 22 may be used as a buried oxide layer. The insulator layer 22 may also be formed within the trenches to form shallow trench isolation (STI) structures 24, which may isolate different structures from the substrate 12, the p-well 18, and the n-wells 20a, 20b, e.g., transistors M1, M1', M2', and M2 shown in FIG. 5. The insulator layer 22 may be an oxide material formed by a conventional deposition process, e.g., chemical vapor deposition (CVD) processes.

In embodiments, the shallow trench isolation structures 24 may also be formed in the substrate 12 using conventional lithography, etching and deposition methods know to those of skill in the art. For example, a resist formed over the substrate 12 is exposed to energy (light) to form a pattern (opening). An etching process with a selective chemistry, e.g., reactive ion etching (RIE), will be used to transfer the pattern from the resist layer to from one or more trenches in the substrate 12. The insulator layer 22 may then be deposited using conventional deposition methods, e.g., CVD.

In FIG. 3, a plurality of source regions 26, 26a. 26b and drain regions 28, 28a may be formed over the layer 22 and between the STI regions 24. In embodiments, the source regions 26, 26a, 26b may be a common source region within an active region 30 for adjacent transistors and the drain regions 28, 28a may be common drain regions within the active region 30 for adjacent transistors as described and shown, for example, in FIG. 5.

In embodiments, the source regions 26, 26a, 26b and drain regions 28, 28a may be formed from semiconductor material. Prior to forming the source and drain regions, semiconductor layer 30 may be formed over the insulator layer 22. In embodiments, the semiconductor layer 30 may be the active region (e.g., Rx region) of the device. The semiconductor layer 30 may be on a fully depleted semiconductor-on-insulator (FDSOI) substrate. For example, a semiconductor layer (e.g., Si) 30 may be deposited over the insulator layer 22 by a conventional deposition process, which results in the insulator layer 22 being a buried insulator layer, e.g., buried oxide, hence forming SOI technology. Following conventional polysilicon gate formation using conventional deposition, lithography, and etching processes, a semiconductor material may be formed on sides of the gate structures to form the raised source 26, 26a, 26b and drain regions 28, 28a. More specifically, the semiconductor material may be epitaxially grown with an in-situ doping process to form the source regions 26, 26a, 26b and the drain regions 28, 28a. Contacts 32a-32d may be formed to the gate structures (not shown in FIG. 3). The contacts 32a-32d may be formed by conventional silicide and deposition processes as is known in the art such that no further explanation is required for a complete understanding of the present disclosure.

Figure 4:
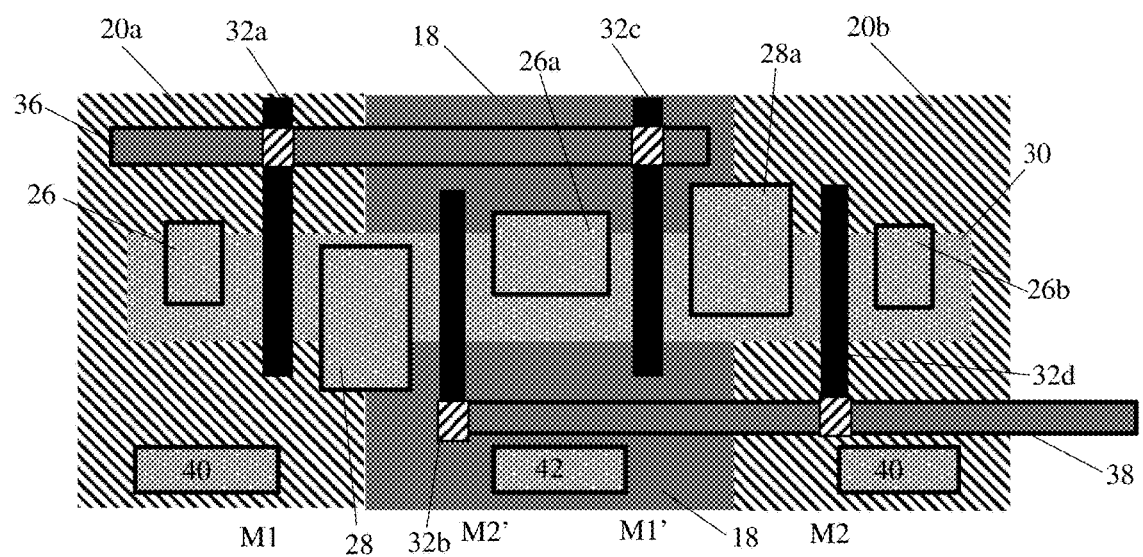
FIG. 4 shows a top view of the back-gate controlled power amplifier, amongst other features, in accordance with aspects of the present disclosure.

FIG. 4 shows a top view of the back-gate controlled power amplifier of FIG. 3. As shown in FIG. 4, the structure 10 includes the p-well 18 between the n-wells 20a, 20b. Further, the n-well 20a may be under transistor M1 and the n-well 20b may be under transistor M2. Further, the p-well 18 may be under transistors M1' and M2'.

In FIG. 4, a gate metal connection 36 extends over the n-well 20a and the p-well 18 and contacts the gates 32a, 32c through via (not in drawing). The gate 32a is between the source region 26 and the drain region 28 and the gate 32c is between the source region 26a and the drain region 28a. A gate metal connection 38 extends over the n-well 20b and the p-well 18 and contacts the gate 32b, 32d. The contact at gate 32b is between the source region 26a and the drain region 28 and the contact at gate 32d is between the source region 26b and the drain region 28a. The back-gate 40 is provided for the transistors M1, M2 and the back-gate 42 is provided for the transistors M1', M2'.

Figure 5:
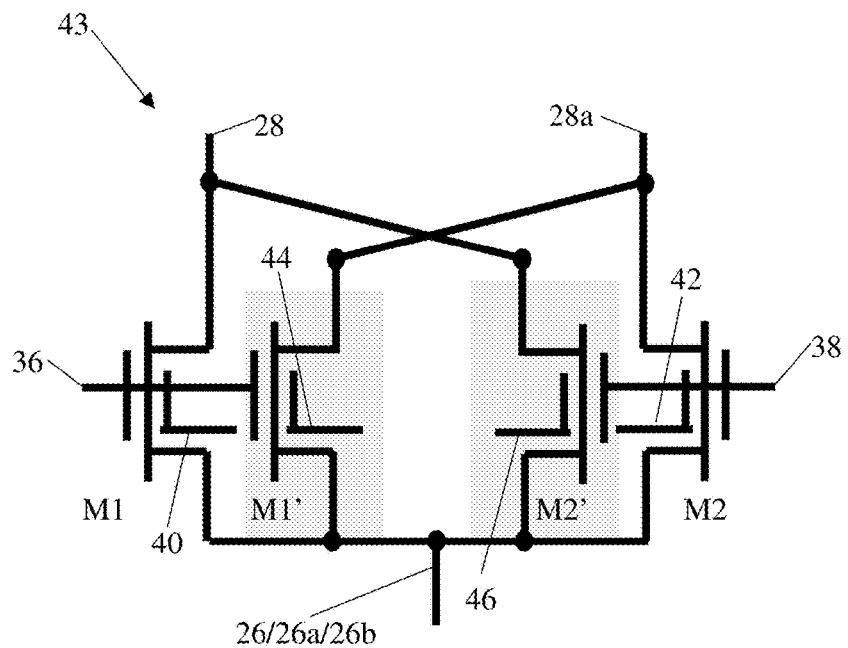
FIG. 5 shows a circuit schematic of the back-gate controlled power amplifier, amongst other features, in accordance with aspects of the present disclosure.

FIG. 5 shows a circuit schematic of the back-gate controlled power amplifier in accordance with aspects of the present disclosure. In FIG. 5, the circuit 43 includes transistors M1, M2, M1', and M2'. The transistors M1 and M2 are differential pairs (i.e., NMOS transistors M1 and M2) with back-gates 40 and 42, respectively. The transistors M1' and M2' are auxiliary devices (i.e., NMOS transistors M1' and M2') with back-gates 44 and 46, respectively. In embodiments, a drain of the transistor M1 is connected to a drain of the transistor M2', as represented by the connection of the drain region 28. Further, a drain of the transistor M1' is connected to a drain of the transistor M2, as represented by the connection of the drain region 28a in FIG. 4. Further, the source regions 26/26a/26b may be a common source region within the active region 30 to all of the transistors M1, M2, M1', and M2'. The gate 36 is connected to the gates of the transistors M1 and M1'. Further, the gate 38 is connected to the gates of the transistors M2 and M2'. The differential pair (i.e., the NMOS transistors M1 and M2) and the auxiliary devices (i.e., the NMOS transistors M1' and M2') share the same continuous active region 30 (i.e., Rx region 30). And the back-gates of the differential pair (i.e., back-gate 40 of transistor M1 and back-gate 42 of transistor M2) and the auxiliary devices (i.e., back-gate 44 of transistor M1' and back-gate 46 of transistor M2') may be controlled independently of each other.

Figure 6:
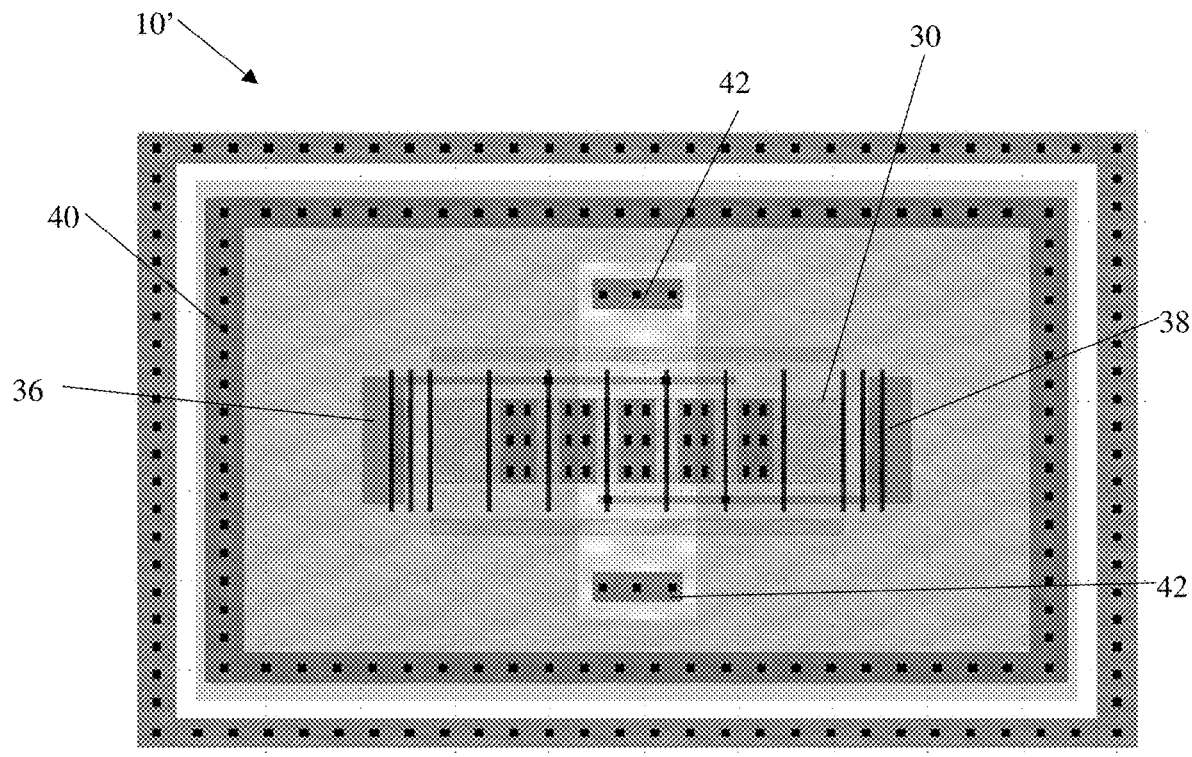
FIG. 6 shows a top view of a back-gate controlled power amplifier of FIG. 5 in accordance with additional aspects of the present disclosure.

FIG. 6 shows another top view of the back-gate controlled power amplifier in accordance with additional aspects of the present disclosure. In FIG. 6, the structure 10' shows the gate 36 separated from the gate 38, and the back-gate 40 of the transistor M1 being a ring structure which surrounds the back-gate 42 of the transistor M2. Also, similar to FIGS. 3-5, the differential pair (i.e., the NMOS transistors M1 and M2) and the auxiliary devices (i.e., the NMOS transistors M1' and M2') share the same continuous active region 30 (i.e., Rx region) while having their back-gates (i.e., back-gate 40 of transistor M1, back-gate 42 of transistor M2, back-gate 44 of transistor M1', and back-gate 46 of transistor M2') controlled independently.

Figure 7:
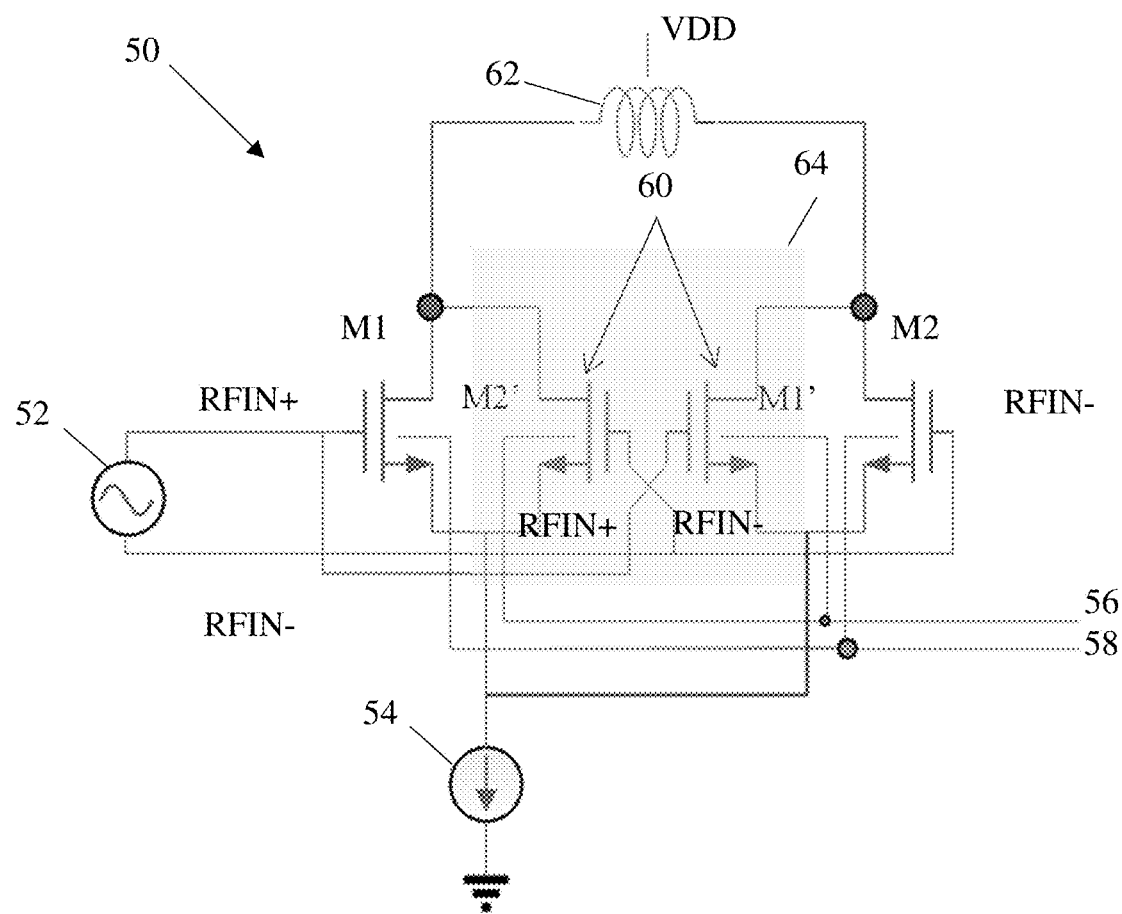
FIGS. 7 and 8 show circuit schematics of the back-gate controlled power amplifier, amongst other features, in accordance with aspects of the present disclosure.

FIG. 7 shows a circuit schematic of back-gate controlled power amplifier in accordance with additional aspects of the present disclosure. In FIG. 7, the circuit 50 includes a voltage source 52, a current source 54, a divided current control 56, a main resistance Ron control 58, a main differential pair (i.e., the NMOS transistors M1 and M2), the auxiliary devices 60 (i.e., the NMOS transistors M1' and M2'), an inductor 62, and a boost mixed cell 64. In FIG. 7, the boost mixed cell 64 has a phase balance by adjusting a current division of the auxiliary devices 60 (i.e., the NMOS transistors M1' and M2').

In FIG. 7, the voltage source 52 is connected between a radio frequency input positive voltage RFIN+ and a radio frequency input negative voltage RFIN−. The current source 54 is connected between a source of the transistor M1' and ground. The divided current control 56 is connected to the back-gates of the auxiliary devices 60 (i.e., the back-gate 44 of the transistor M1' and the back-gate 46 of the transistor M2'). The main resistance Ron control 58 is connected to the back-gates of the main differential pair (i.e., the back-gate 40 of the transistor M1 and the back-gate 42 of the transistor M2). The transistor M1 has a gate 36 connected to a radio frequency input positive voltage RFIN+, a drain connected to the inductor 62, and a source connected to a source of the transistor M2'. The transistor M2 has a gate 38 connected to the radio frequency input negative voltage RFIN−, a drain connected to the inductor 62, and a source connected to a source of the transistor M1'. The transistor M1' has a gate 36 connected to the radio frequency input positive voltage RFIN+ and a drain connected to the inductor 62. The transistor M2' has a gate connected to the radio frequency input negative voltage RFIN− and a drain connected to the inductor 62. The boost mixed cell 64 includes the transistor M1' and the transistor M2'. As further shown, the drain of the transistor M1 and the drain of the transistor M2' may be connected to one side of the inductor 62 and the drain of the transistor M2 and the drain of the transistor M1' may be connected to the other side of the inductor 62.

Still referring to FIG. 7, the back gate controls of the auxiliary devices 60 (i.e., the back-gate 44 of transistor M1' and the back-gate 46 of transistor M2') may allow a gain control while maintaining a competitive frequency response without affecting a front end operation (i.e., gate 36 of the transistor M1' and gate 38 of the transistor M2'). In FIG. 7, operation of the dual back gate control includes controlling the main resistance Ron control 58 of a main signal path for the main differential pair (i.e., the NMOS transistors M1 and M2) and adjusting the current division between the auxiliary devices 60 (i.e., the NMOS transistors M1' and M2') and the tail current source 54.

Figure 8:
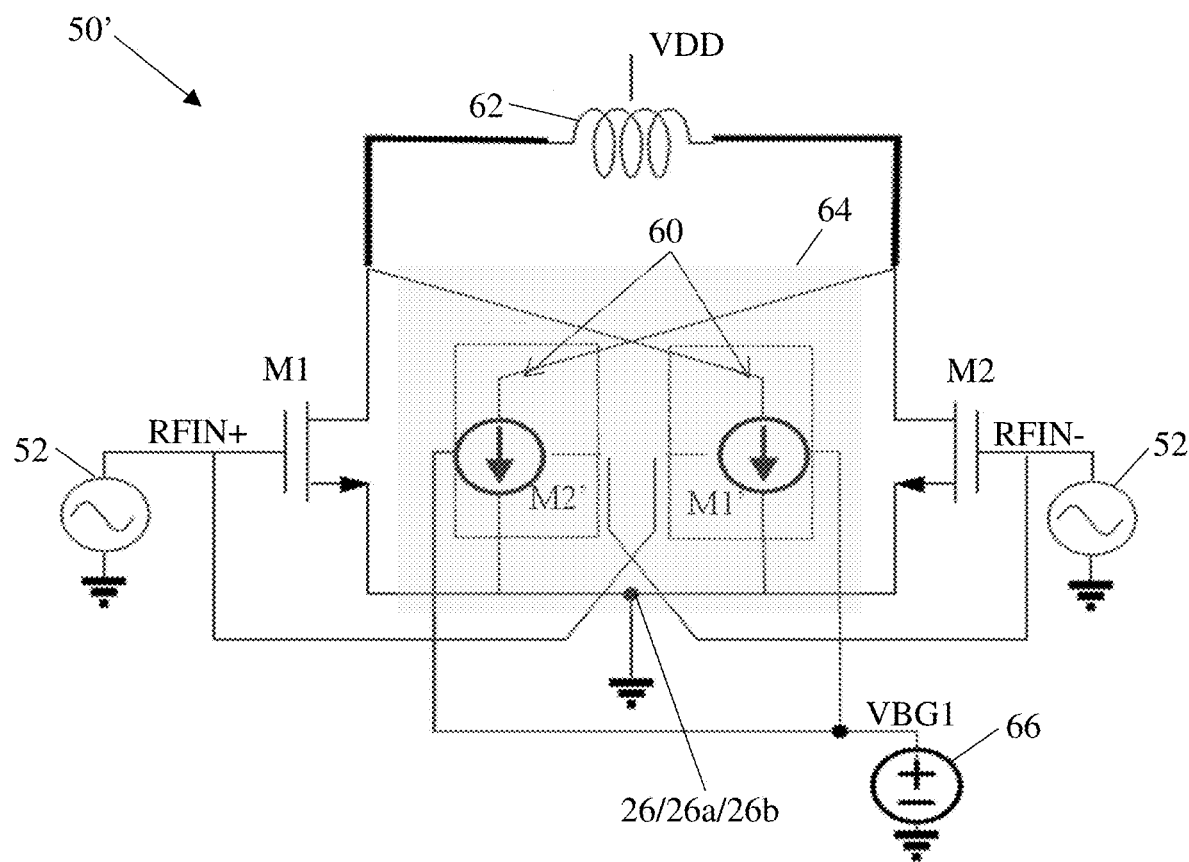

FIG. 8 shows a circuit 50' with a current division control. In FIG. 8, a voltage source 66 and two voltage sources 52 are used, compared to the circuit of FIG. 8. instead of a current source and one voltage source. In FIG. 8, the voltage source 66 is connected to a back gate voltage VBG1 of the transistor M1' and ground. One of the voltage sources 52 is connected to the radio frequency input positive voltage RFIN+ and ground, and the other voltage source 52 is connected to the radio frequency input negative voltage RFIN− and ground. A drain of the transistor M2' is connected to a drain of the transistor M2. Further, the drain of the transistor M1' is connected to the drain of the transistor M1.

Figure 9:
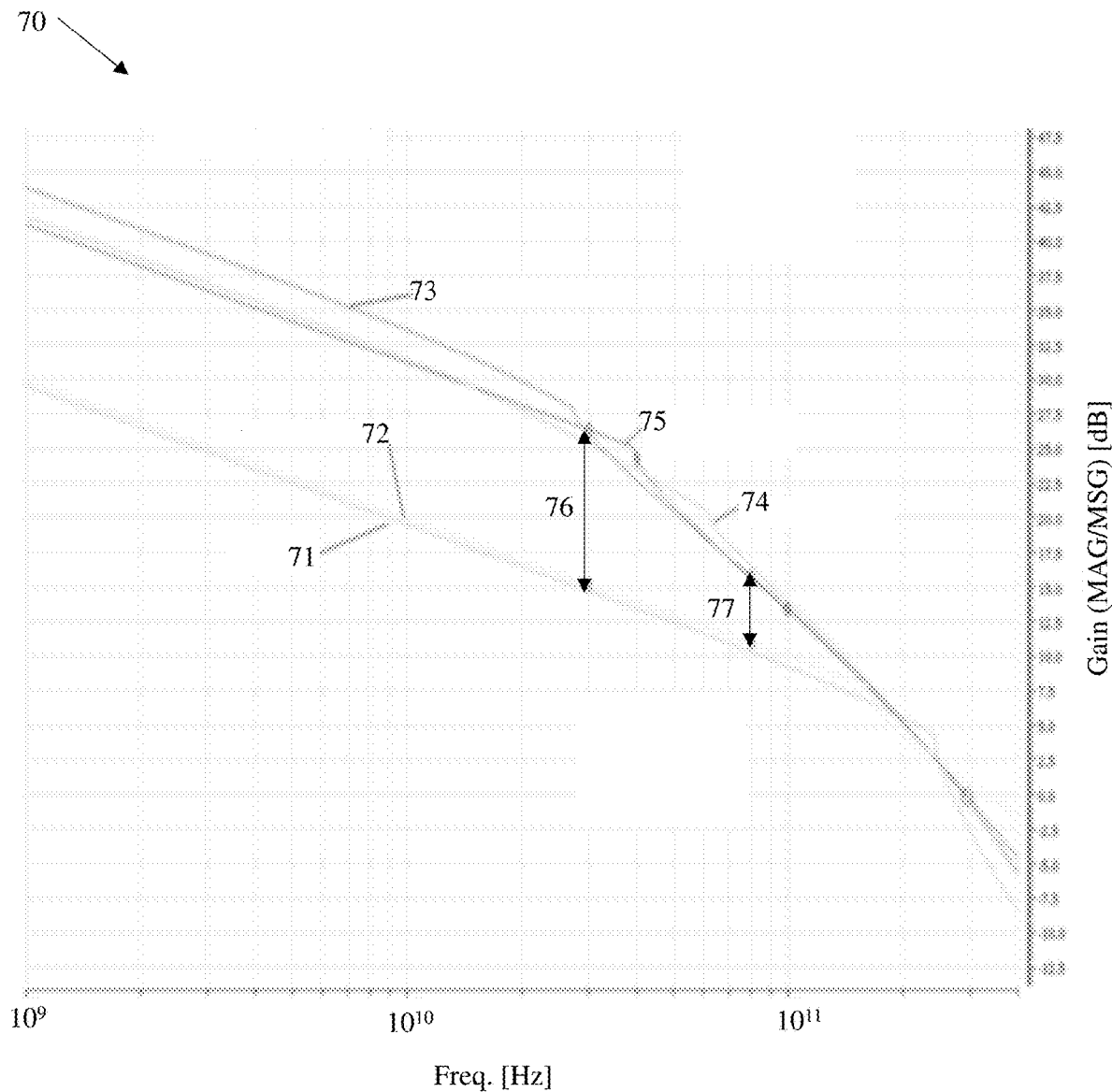
FIGS. 9 and 10 show graphs related to the back-gate controlled power amplifier in accordance with aspects of the present disclosure.

FIG. 8 further shows a common source node connected to source regions 26/26a/26b of each of the transistors M1, M2, M1', M2'. In FIG. 9, by controlling the voltage source 66 to input the back gate voltage VBG1 to the back-gates of the transistors M1' and M2', the back gate current of the transistors M1' and M2' can be controlled to adjust a current division between the transistors M1' and M2', as indicated by the arrows in the transistors M1' and M2'.

In FIGS. 7 and 8, the circuits 50 and 50' can include horizontal connections which include the gate 36 (G+) of the transistor M1, the gate 38 (G−) of the transistor M2, the drain (D+) of the transistor M1, and the drain (D−) of the transistor M2. Further, the source regions 26, 26a, 26b may be a common point for both the transistor M1 and the transistor M2. The capacitor gate to drain Cgd+ waveform and the capacitor gate to drain Cgd− waveform are opposite waveforms which can be cancelled in the circuits 50 and 50'. The cancellation of the waveforms Cgd+ and Cgd− in the present disclosure reduces the parasitic effects that are found in known circuits.

Also, in FIGS. 7 and 8, the circuits 50 and 50' provide a maximum gain boost (e.g., from 30 GHz to 110 GHz), a linearity benefit, a power control with a back-gate, and a compact routing layout. In particular, the circuits 50 and 50' provide the maximum gain boost by implementing the auxiliary devices 60. Further, the circuits 50 and 50' provide the linearity benefit by preventing circuit oscillations that occur when a source is floating. The circuits 50 and 50' can also control the power by an application of a negative voltage to the back-gates 44, 46 of the transistors M1' and M2'. The circuits 50 and 50' provide the compact routing layout by minimizing cross-over routings to decrease a parasitic and gain degradation.

Figure 10:
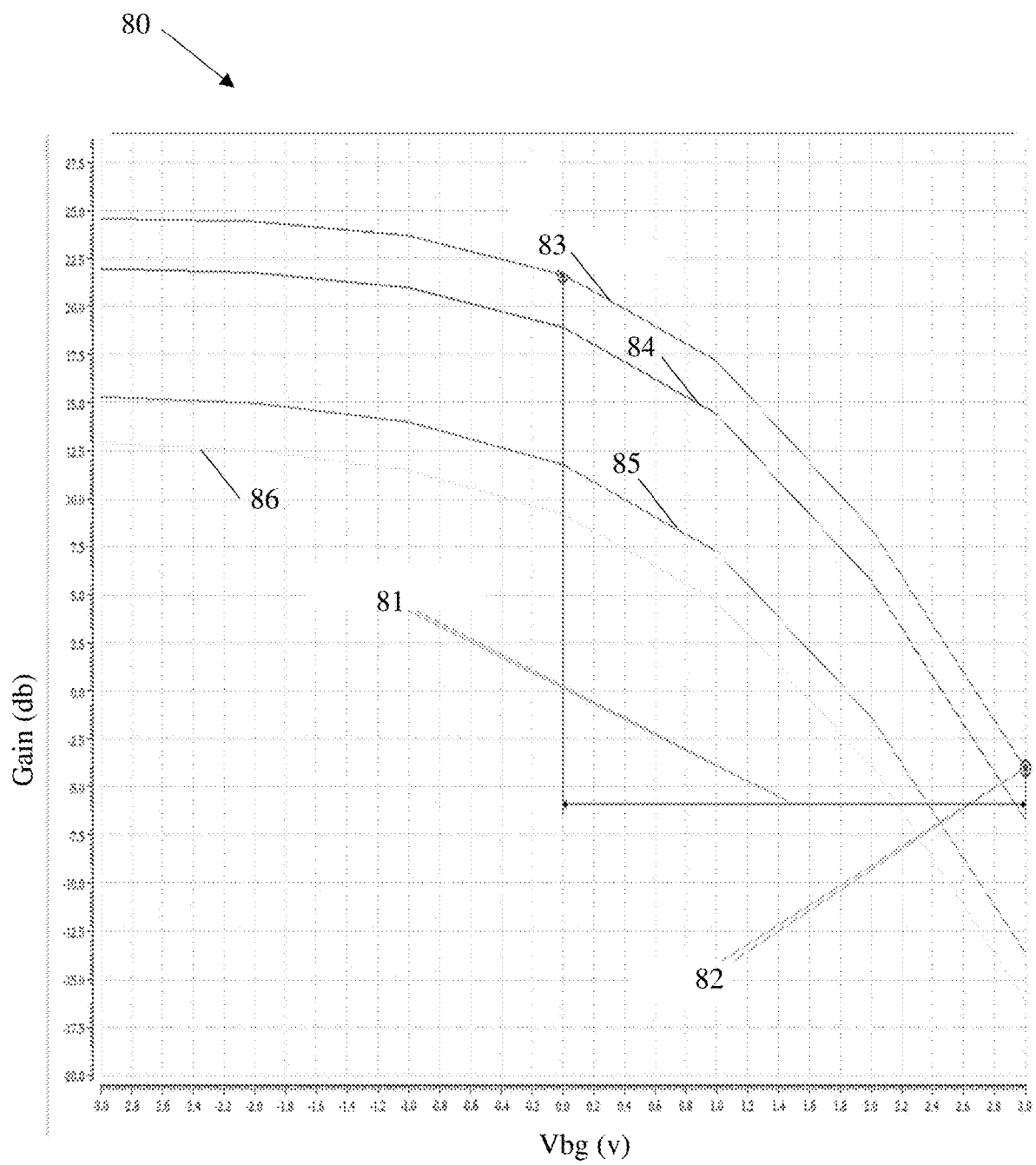

FIGS. 9 and 10 show graphs related to performances of the back-gate controlled power amplifier. The graph 70 includes a y-axis representing maximum available gain/ maximum stable gain (MAG/MSG) in dB and an x-axis representing Frequency in Hertz. In FIG. 9, graph 70 includes a known source-drain connected circuit represented by line 71, a known regular differential pair circuit represented by line 72, a known floating source circuit represented by line 73, and a known resistor at source represented by circuit line 74, and a gain boost circuit of the present disclosure represented by line 75. The gain boost line 75 has a gain boost value 76 of approximately 11 dB at 30 GHz and a gain boost value 77 of approximately 5 dB at 80 GHz in comparison to the regular differential pair known circuit line 72.

In FIG. 10, graph 80 represents a back gate having a gain control. The graph 80 includes a y-axis representing gain in dB and an x-axis representing the back gate voltage Vbg in volts. The graph 80 includes a 30 GHz situation represented by line 83, a 40 GHz situation represented by line 84, an 80 GHz situation represented by line 85, and a 100 GHz situation represented by line 86.

In the graph 80 of FIG. 10, across the frequency range of 40 GHz to 100 GHz, at the back gate voltage Vbg of −3 volts, the gain reaches its peak and flattens out, and is stable below −3 volts. At the 30 GHz situation represented by line 83, there is approximately 25 dB of gain control at the back gate voltage Vbg of −3 volts. At the 40 GHz situation represented by line 84, there is approximately −6 dB of gain control 81 at the back gate voltage Vbg of 3 volts. At the 30 GHz situation represented by line 83, there is approximately −4 dB of gain control 82 at the back gate voltage Vbg of 3 volts. Further, the gain control may be adjusted with the back gate voltage Vbg on a mixer structure without affecting a front gate function. Further, the gain control range of the present disclosure is smaller than known circuits because the current apply is limited in mmWave circuits.

The back-gate controlled power amplifier may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of auxiliary circuit devices comprising back-gate controls to perform a boost gain; and
   a differential pair of circuit devices connected to the plurality of auxiliary circuit devices,
   wherein a first transistor of the differential pair of circuit devices shares a gate with a first transistor of the plurality of auxiliary circuit devices and a second transistor of the differential pair of circuit devices shares a separate gate with a second transistor of the plurality of auxiliary circuit devices, and a drain of the first transistor of the differential pair of circuit devices is connected to a drain of the second transistor of the plurality of auxiliary circuit devices, and the differential pair of circuit devices and the plurality of auxiliary circuit devices are formed on a triple-well neighboring n-well layout, and the plurality of auxiliary circuit devices being formed over a shared well.

2. The structure of claim 1, wherein the plurality of auxiliary circuit devices comprises a first NMOS transistor and a second NMOS transistor.

3. The structure of claim 2, wherein the differential pair of circuit devices comprise a third NMOS transistor and a fourth NMOS transistor.

4. The structure of claim 3, wherein the first NMOS transistor, the second NMOS transistor, the third NMOS transistor, and the fourth NMOS transistor have a common source connected to ground.

5. The structure of claim 3, wherein a gate of the first NMOS transistor is connected to a gate of the third NMOS transistor.

6. The structure of claim 3, wherein a gate of the second NMOS transistor is connected to a gate of the fourth NMOS transistor.

7. The structure of claim 3, wherein a drain of the first NMOS transistor and a drain of the second NMOS transistor are connected to an inductor.

8. The structure of claim 3, further comprising a voltage source connected to a back-gate of the first NMOS transistor and a back-gate of the second NMOS transistor.

9. The structure of claim 8, wherein the voltage source applies a negative voltage to the back-gate of the first NMOS transistor and the back-gate of the second NMOS transistor to provide the boost gain without affecting a gate of first NMOS transistor and a gate of the second NMOS transistor.

10. A structure comprising:
    a first transistor of a plurality of auxiliary circuit devices comprising a back-gate connected to a divided current control and a source connected to a current source;
    a second transistor of the plurality of auxiliary circuit devices comprising a back-gate connected to the divided current control and a source connected to the current source;
    the divided current control controls a gain using the first-back gate of the first transistor and the second back-gate of the second transistor; and
    a differential pair of circuit devices comprising a first transistor having a gate shared with the first transistor of the plurality of auxiliary circuit devices, a second transistor of the differential pair of circuit devices sharing a separate gate with the second transistor of the plurality of auxiliary circuit devices, a drain of the first transistor of the differential pair of circuit devices being connected to a drain of the second transistor of the plurality of auxiliary circuit devices, and a drain of the second transistor of the differential pair of circuit devices being connected to a drain of the first transistor of the plurality of auxiliary circuit devices, and the differential pair of circuit devices and the plurality of auxiliary circuit devices are formed on a triple-well neighboring n-well layout, and the plurality of auxiliary circuit devices being formed over a shared well.

11. The structure of claim 10, wherein the first transistor of the plurality of auxiliary circuit devices comprises a first NMOS transistor and the second transistor of the plurality of auxiliary circuit devices comprises a second NMOS transistor.

12. The structure of claim 11, wherein a drain of the first NMOS transistor and a drain of the second NMOS transistor are connected to an inductor.

13. The structure of claim 10, wherein a gate of the first transistor of the plurality of auxiliary circuit devices is connected to a radio frequency input positive voltage.

14. The structure of claim 10, wherein a gate of the second transistor is connected to a radio frequency input negative voltage.

15. The structure of claim 10, further comprising back-gate controls for the differential pair of circuit devices and back-gate controls for the plurality of auxiliary circuit devices, each of which are independently controlled.

16. A structure comprising:
a substrate comprising a plurality of p-wells in a back-gate region on a fully depleted semiconductor on insulator (FDSOI) substrate;
a differential pair of main transistors over a plurality of n-wells;
a plurality of auxiliary devices over the plurality of p-wells; and
a continuous active region shared by the differential pair of transistors and the plurality of auxiliary devices,
wherein a first transistor of the differential pair of main transistors shares a gate with the first transistor of the plurality of auxiliary devices and a second transistor of the differential pair of main transistors shares a separate gate with the second transistor of the plurality of auxiliary devices, and a drain of the first transistor of the differential pair of main transistors is connected to a drain of the second transistor of the plurality of auxiliary devices and a drain of the second transistor of the differential pair of main transistors is connected to a drain of the first transistor of the plurality of auxiliary devices, and the differential pair of circuit devices and the plurality of auxiliary devices are formed on a triple-well neighboring n-well layout, and the plurality of auxiliary devices being formed over a shared p-well.

17. The structure of claim 16, wherein the back-gate region is controlled independently of a plurality of gates of the differential pair of transistors and the plurality of auxiliary devices.

18. The structure of claim 16, wherein the first transistor of the plurality of auxiliary devices comprises a first NMOS transistor and the second transistor of the plurality of auxiliary devices comprises a second NMOS transistor.

19. The structure of claim 18, wherein the first transistor of the differential pair of main transistors comprises a third NMOS transistor and the second transistor of the differential pair of main transistors comprises a fourth NMOS transistor.

20. The structure of claim 19, further comprising back-gate controls for the differential pair of main transistors and back-gate controls for the plurality of auxiliary devices, each of which are independently controlled.

* * * * *